(12) United States Patent
Byun

(10) Patent No.: US 11,113,203 B2
(45) Date of Patent: Sep. 7, 2021

(54) CONTROLLER AND METHOD OF OPERATING THE SAME

(71) Applicant: SK hynix Inc., Gyeonggi-do (KR)

(72) Inventor: Eu Joon Byun, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 50 days.

(21) Appl. No.: 16/673,620

(22) Filed: Nov. 4, 2019

(65) Prior Publication Data

US 2020/0349084 A1    Nov. 5, 2020

(30) Foreign Application Priority Data

Apr. 30, 2019  (KR) .................. 10-2019-0050185

(51) Int. Cl.
| | | |
|---|---|---|
| *G06F 12/0891* | (2016.01) | |
| *G06F 12/0873* | (2016.01) | |
| *G11C 11/409* | (2006.01) | |
| *G06F 13/16* | (2006.01) | |
| *G06F 12/02* | (2006.01) | |

(52) U.S. Cl.
CPC ...... *G06F 12/0891* (2013.01); *G06F 12/0238* (2013.01); *G06F 12/0873* (2013.01); *G06F 13/1668* (2013.01); *G11C 11/409* (2013.01)

(58) Field of Classification Search
CPC ............ G06F 12/0848; G06F 12/1072; G06F 12/0868; G06F 12/0246; G06F 12/121; G06F 12/0891; G06F 12/0871
See application file for complete search history.

(56) References Cited

U.S. PATENT DOCUMENTS

| | | | |
|---|---|---|---|
| 2015/0193354 A1* | 7/2015 | Kwon | ................. G06F 12/0246 711/207 |
| 2018/0052625 A1* | 2/2018 | Cho | ...................... G06F 3/0659 |
| 2019/0155723 A1* | 5/2019 | Park | .................... G06F 12/0866 |
| 2019/0294376 A1* | 9/2019 | Park | ....................... G06F 3/064 |

FOREIGN PATENT DOCUMENTS

| | | |
|---|---|---|
| KR | 10-1226600 | 1/2013 |
| KR | 10-1676159 | 11/2016 |

* cited by examiner

*Primary Examiner* — Sean D Rossiter
(74) *Attorney, Agent, or Firm* — IP & T Group LLP

(57) ABSTRACT

Provided herein may be a controller and a method of operating the same. The controller for controlling an operation of a semiconductor memory device may include a request analyzer, a map cache controller, and a command generator. The request analyzer receives a first request from a host. The map cache controller generates a first mapping segment including a plurality of mapping entries and a flag bit based on the first request, and sets a value of the flag bit depending on whether data corresponding to the first mapping segment is random data or sequential data. The command generator generates a program command for programming the mapping segment.

14 Claims, 14 Drawing Sheets

FIG. 9A

| ME1 | ME2 | ME3 | ME4 | ME5 | ME6 | ME7 | ME8 | ... | MEj | MEk | FB |

FIG. 9B

AT LEAST SOME MAPPING ENTRIES INDICATE RANDOM LOCATIONS : SET FB TO '0'

| ME1 | ME2 | ME3 | ME4 | ME5 | ME6 | ME7 | ME8 | ... | MEj | MEk | 0 |

FIG. 9C

ALL MAPPING ENTRIES INDICATE CONSECUTIVE LOCATIONS: SET FB TO '1'

| ME1 | ME2 | ME3 | ME4 | ME5 | ME6 | ME7 | ME8 | ... | MEj | MEk | 1 |

AT LEAST SOME MAPPING ENTRIES INDICATE RANDOM LOCATIONS

STORE IN RANDOM MAP CACHE

ALL MAPPING ENTRIES INDICATE CONSECUTIVE LOCATIONS

STORE IN SEQUENTIAL MAP CACHE

CONTROLLER AND METHOD OF OPERATING THE SAME

CROSS-REFERENCE TO RELATED APPLICATION

The present application claims priority under 35 U.S.C. § 119(a) to Korean patent application number 10-2019-0050185, filed on Apr. 30, 2019, which is incorporated herein by reference in its entirety.

BACKGROUND

Field of Invention

Various embodiments of the present disclosure generally relate to an electronic device, and more particularly, to a controller for controlling a semiconductor memory device and a method of operating the controller.

Description of Related Art

A semiconductor memory device may have a two-dimensional (2D) structure in which strings are horizontally arranged on a semiconductor substrate. Alternatively, the semiconductor memory device may have a three-dimensional (3D) structure in which strings are vertically stacked on a semiconductor substrate. As a 2D semiconductor memory device is approaching its physical scaling limit (i.e., limit in the degree of integration), semiconductor manufacturers are producing more 3D semiconductor memory devices. Operation of either type of semiconductor memory device is controlled by a controller in response to a request received from a host.

SUMMARY

Various embodiments of the present disclosure are directed to a controller that may efficiently manage a map cache and a method of operating the controller.

An embodiment of the present disclosure may provide for a controller for controlling an operation of a semiconductor memory device. The controller may include a request analyzer configured to receive a first request from a host, a map cache controller configured to generate a first mapping segment including a plurality of mapping entries and a flag bit based on the first request and to set a value of the flag bit depending on whether data corresponding to the first mapping segment is random data or sequential data, and a command generator configured to generate a program command for programming the first mapping segment.

In an embodiment, the first request may include one of a write request and an update request.

In an embodiment, the controller may further include a map cache configured to store the first mapping segment, wherein the request analyzer receives a second request from the host, and wherein the map cache controller controls, based on the second request, an operation of the command generator depending on whether a second mapping segment corresponding to the second request is stored in the map cache.

In an embodiment, the second request may include a read request.

In an embodiment, when the second mapping segment is stored in the map cache, the map cache controller may control the command generator to generate a read command for reading data corresponding to the second request based on the second mapping segment.

In an embodiment, when the second mapping segment is not stored in the map cache, the map cache controller may control the command generator to generate a read command for reading the second mapping segment.

In an embodiment, the controller may further include a data receiver configured to receive read data from the semiconductor memory device, wherein the data receiver is configured to, when the second mapping segment is received as the read data, transfer a value of a flag bit in the second mapping segment to the map cache controller, and transfer the second mapping segment to the map cache.

In an embodiment, the map cache may include a random map cache and a sequential map cache, and the map cache controller may control the map cache to store the second mapping segment in one of the random map cache and the sequential map cache based on the value of the flag bit.

In an embodiment, when the value of the flag bit indicates that data corresponding to the second mapping segment is random data, the map cache controller may store mapping entries in the second mapping segment in the random map cache.

In an embodiment, when the value of the flag bit indicates that data corresponding to the second mapping segment is sequential data, the map cache controller may generate sequential map data based on mapping entries in the second mapping segment and store the sequential map data in the sequential map cache.

In an embodiment, the sequential map data may include data indicating a start location of the sequential data corresponding to the mapping entries in the second mapping segment, and data indicating a length of the sequential data corresponding to the mapping entries.

In an embodiment, the map cache controller may control the command generator to generate a read command for reading data corresponding to the second request based on the second mapping segment stored in the map cache.

An embodiment of the present disclosure may provide for a method of operating a controller for controlling a semiconductor memory device. The method may include generating a mapping segment including a plurality of mapping entries and a flag bit, the mapping entries each indicating a mapping relationship between a logical address and a physical address of data to be programmed to the semiconductor memory device, determining whether data corresponding to the mapping segment is sequential data based on the mapping entries, and setting a value of the flag bit based on a result of the determination.

In an embodiment, setting the value of the flag bit may include setting the value of the flag bit to a first value when the data corresponding to the mapping segment is sequential data.

In an embodiment, setting the value of the flag bit may include setting the value of the flag bit to a second value when the data corresponding to the mapping segment is sequential data.

In an embodiment, the method may further include, after setting the value of the flag bit, generating a program command for programming the mapping segment and transferring the program command to the semiconductor memory device.

An embodiment of the present disclosure may provide for a method of operating a controller for controlling a semiconductor memory device. The method may include determining a mapping segment to read from the semiconductor memory device, generating a read command for reading the mapping segment and transferring the read command to the semiconductor memory device, receiving the mapping segment from the semiconductor memory device, and storing the mapping segment in a map cache based on a characteristic of the data of the mapping segment.

In an embodiment, the storing of the mapping segment in the map cache may include storing a plurality of mapping entries in the mapping segment in a random map cache included of the map cache when a flag bit of the mapping segment indicates that the data corresponding to the mapping segment is random data.

In an embodiment, the storing of the mapping segment in the map cache may include, when a flag bit of the mapping segment indicates that the data corresponding to the mapping segment is sequential data, generating sequential map data based on a plurality of mapping entries in the mapping segment, and storing the sequential map data in a sequential map cache included of the map cache.

In an embodiment, the sequential map data may include data indicating a start location of the sequential data corresponding to the mapping entries in the mapping segment, and data indicating a length of the sequential data corresponding to the mapping entries.

An embodiment of the present disclosure may provide for a storage device including a memory device and a controller including a first cache and a second cache. The controller may be suitable for generating a map segment in response to a write request, the map segment including a field having a value indicating a characteristic of data corresponding to the write request, storing the map segment in one of the first cache and the second cache based on the value in the field, and writing the map segment in the memory device.

In an embodiment, the first cache may be for storing the map segment corresponding to random data, and the second cache may be for storing the map segment corresponding to sequential data.

BRIEF DESCRIPTION OF THE DRAWINGS

FIGS. 9A, 9B, and 9C are diagrams illustrating a mapping segment stored in a semiconductor memory device according to an embodiment of the present disclosure.

DETAILED DESCRIPTION

Figure 1:
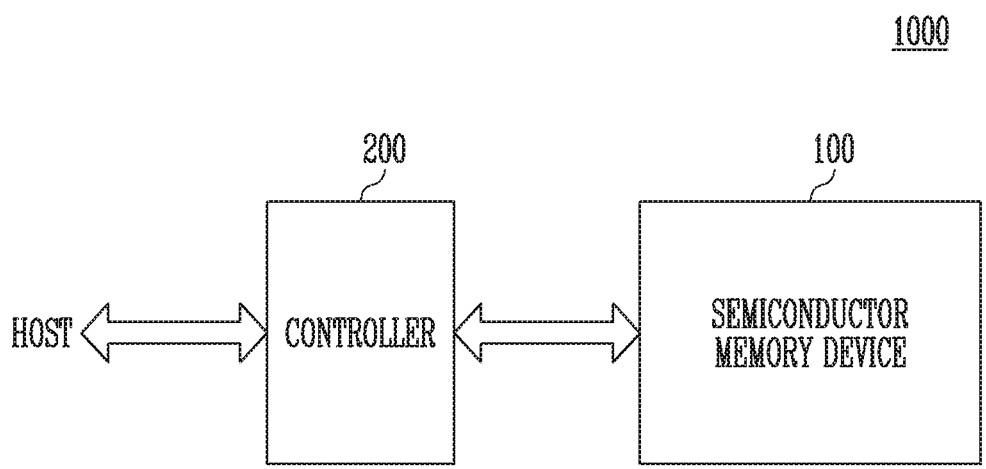
FIG. 1 is a block diagram illustrating a storage device according to an embodiment of the present disclosure.

Advantages and features of the present disclosure, and methods for achieving the same will be explained with reference to embodiments described below in detail together with the accompanying drawings. Accordingly, the present disclosure is not limited to the following embodiments but embodied in other forms. Rather, these embodiments are provided so that the present disclosure is thorough and complete and fully conveys the technical spirit of the disclosure to those skilled in the art. Throughout the specification, reference to "an embodiment," "another embodiment" or the like is not necessarily to only one embodiment, and different references to any such phrase are not necessarily to the same embodiment(s).

It is also noted that in this specification, "connected/coupled" refers to one component directly or indirectly connecting to coupling with another component. In the specification, when an element is referred to as "comprising" or "including" a component, it does not preclude another component but may further include one or more other components, unless the context clearly indicates otherwise.

Embodiments in accordance with the present disclosure are below described in detail with reference to the accompanying drawings. Throughout the drawings, the same reference numerals are used to designate the same or similar components. Details of well-known configurations and functions may be omitted to avoid unnecessarily obscuring features of the present disclosure.

FIG. 1 is a block diagram illustrating a storage device 1000 according to an embodiment of the present disclosure.

Referring to FIG. 1, the storage device 1000 includes a semiconductor memory device 100 and a controller 200. The storage device 1000 communicates with a host. The controller 200 controls the overall operation of the semiconductor memory device 100. The controller 200 controls the operation of the semiconductor memory device 100 in response to a command received from the host. Herein, the semiconductor memory device may be also referred as a memory device.

The semiconductor memory device 100 is operated under the control of the controller 200. The semiconductor memory device 100 includes a memory cell array having a plurality of memory blocks. In an embodiment, the semiconductor memory device 100 may be a flash memory device.

The controller 200 may receive a data write request, a data read request or an erase request from the host, and may control the semiconductor memory device 100 in response to the received request. In detail, the controller 200 may generate commands for controlling the operation of the semiconductor memory device 100, and may transmit the commands to the semiconductor memory device 100.

The semiconductor memory device 100 may receive a command and an address from the controller 200, and may access the area of the memory cell array, selected by the address. That is, the semiconductor memory device 100 performs an internal operation corresponding to the command on the area selected by the address.

For example, the semiconductor memory device 100 may perform a program operation, a read operation, and an erase operation. During a program operation, the semiconductor memory device 100 may program data to the area selected by the address. During a read operation, the semiconductor memory device 100 may read data from the area selected by the address. During an erase operation, the semiconductor memory device 100 may erase data stored in the area selected by the address.

Figure 2:
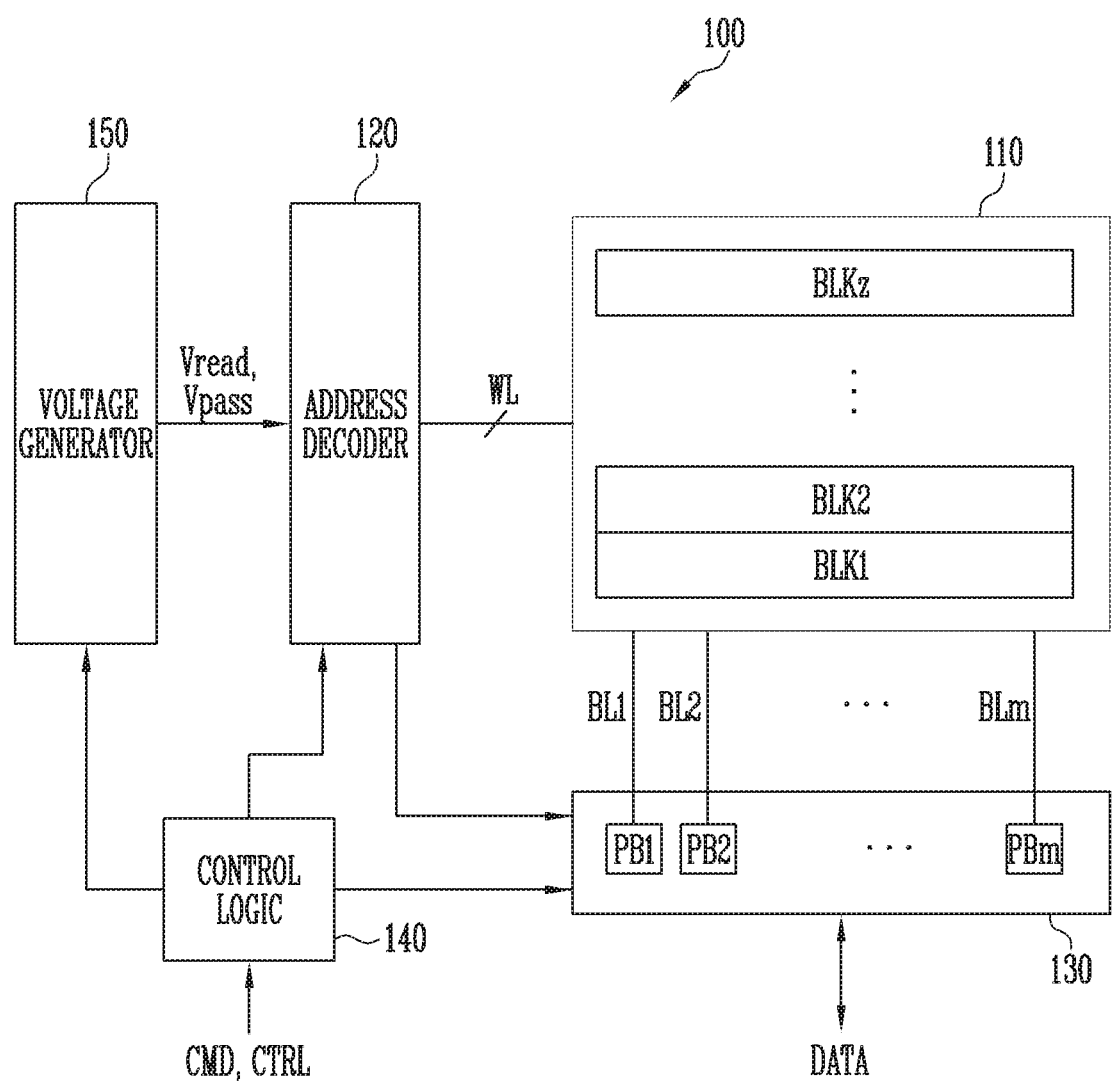
FIG. 2 is a block diagram illustrating a semiconductor memory device according to an embodiment of the present disclosure.

FIG. 2 is a block diagram illustrating a semiconductor memory device 100 according to an embodiment of the present disclosure.

Referring to FIG. 2, the semiconductor memory device 100 includes a memory cell array 110, an address decoder 120, a read and write circuit 130, control logic 140, and a voltage generator 150.

The memory cell array 110 includes a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz includes a plurality of memory cells. In an embodiment, the plurality of memory cells may be nonvolatile memory cells, which may be implemented with a vertical channel structure. The memory cell array 110 may be implemented as a two-dimensional (2D) structure or a three-dimensional (3D) structure. Each of the memory cells included in the memory cell array 110 may store at least one bit of data. In an embodiment, each of the memory cells in the memory cell array 110 may be a single-level cell (SLC), which stores 1-bit data. In an embodiment, each of the memory cells in the memory cell array 110 may be a multi-level cell (MLC), which stores 2-bit data. In an embodiment, each of the memory cells in the memory cell array 110 may be a triple-level cell (TLC), which stores 3-bit data. In an embodiment, each of the memory cells in the memory cell array 110 may be a quad-level cell (QLC), which stores 4-bit data. In various embodiments, the memory cell array 110 may include a plurality of memory cells, each of which stores 5 or more bits of data.

The address decoder 120, the read and write circuit 130, the control logic 140, and the voltage generator 150 are operated as a peripheral circuit for driving the memory cell array 110. The address decoder 120 is coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address, among the received addresses. The address decoder 120 selects at least one memory block based on the decoded block address. When a read voltage application operation is performed during a read operation, the address decoder 120 may apply a read voltage Vread, generated by the voltage generator 150, to a selected word line of a selected memory block, and may apply a pass voltage Vpass to remaining unselected word lines. During a program verify operation, the address decoder 120 may apply a verify voltage, generated by the voltage generator 150, to a selected word line of a selected memory block, and may apply the pass voltage Vpass to remaining unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received at the request of read and program operations may include a block address, a row address and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, and an address buffer.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm are coupled to the memory cell array 110 through the bit lines BL1 to BLm. During a read or program verify operation, in order to sense threshold voltages of the memory cells, the page buffers PB1 to PBm may continuously supply sensing current to the bit lines coupled to the memory cells while each of the page buffers PB1 to PBm senses, through a sensing node, a change in the amount of flowing current depending on the program state of a corresponding memory cell and latches it as sensing data. The read and write circuit 130 is operated in response to page buffer control signals outputted from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page resistors).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. The control logic 140 may output a control signal for controlling a precharge potential level at the sensing node of the plurality of page buffers PB1 to PBm. The control logic 140 may control the read and write circuit 130 to perform a read operation of the memory cell array 110.

The voltage generator 150 may generate a read voltage Vread and a pass voltage Vpass required for a read operation in response to a control signal outputted from the control logic 140. The voltage generator 150 may include a plurality of pumping capacitors for receiving an internal supply voltage to generate a plurality of voltages having various voltage levels. The voltage generator 150 may generate a plurality of voltages by selectively enabling the plurality of pumping capacitors under the control of the control logic 140.

The address decoder 120, the read and write circuit 130, and the voltage generator 150 may collectively function as a peripheral circuit which performs a read operation, a write operation, and an erase operation on the memory cell array 110. The peripheral circuit may perform a read operation, a write operation, and an erase operation on the memory cell array 110 under the control of the control logic 140.

Figure 3:
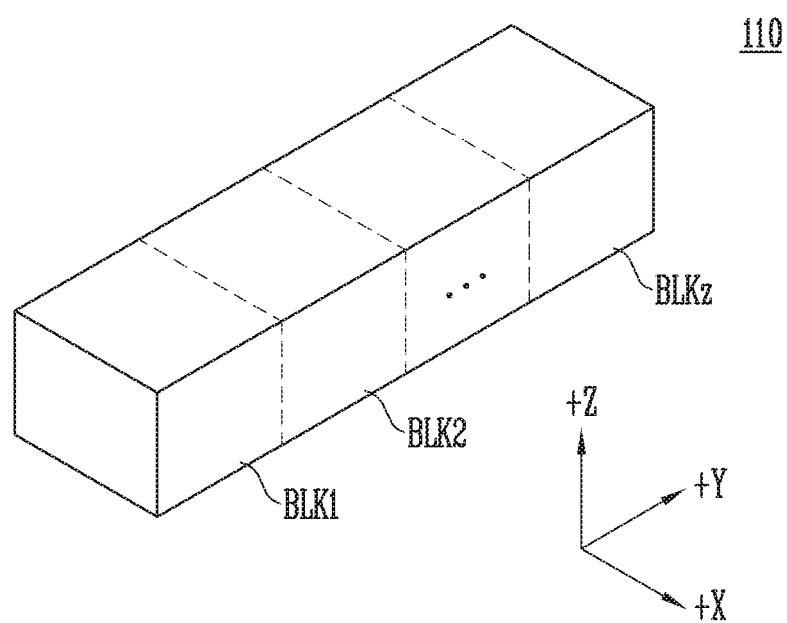
FIG. 3 is a diagram illustrating an example of a memory cell array of FIG. 2.

FIG. 3 is a diagram illustrating an example of the memory cell array 110 of FIG. 2.

Referring to FIG. 3, the memory cell array 110 may include a plurality of memory blocks BLK1 to BLKz. Each memory block may have a three-dimensional (3D) structure. Each memory block includes a plurality of memory cells stacked on a substrate. Such memory cells are arranged along a positive X (+X) direction, a positive Y (+Y) direction, and a positive Z (+Z) direction. The structure of each memory block is described in detail below with reference to FIGS. 4 and 5.

Figure 4:
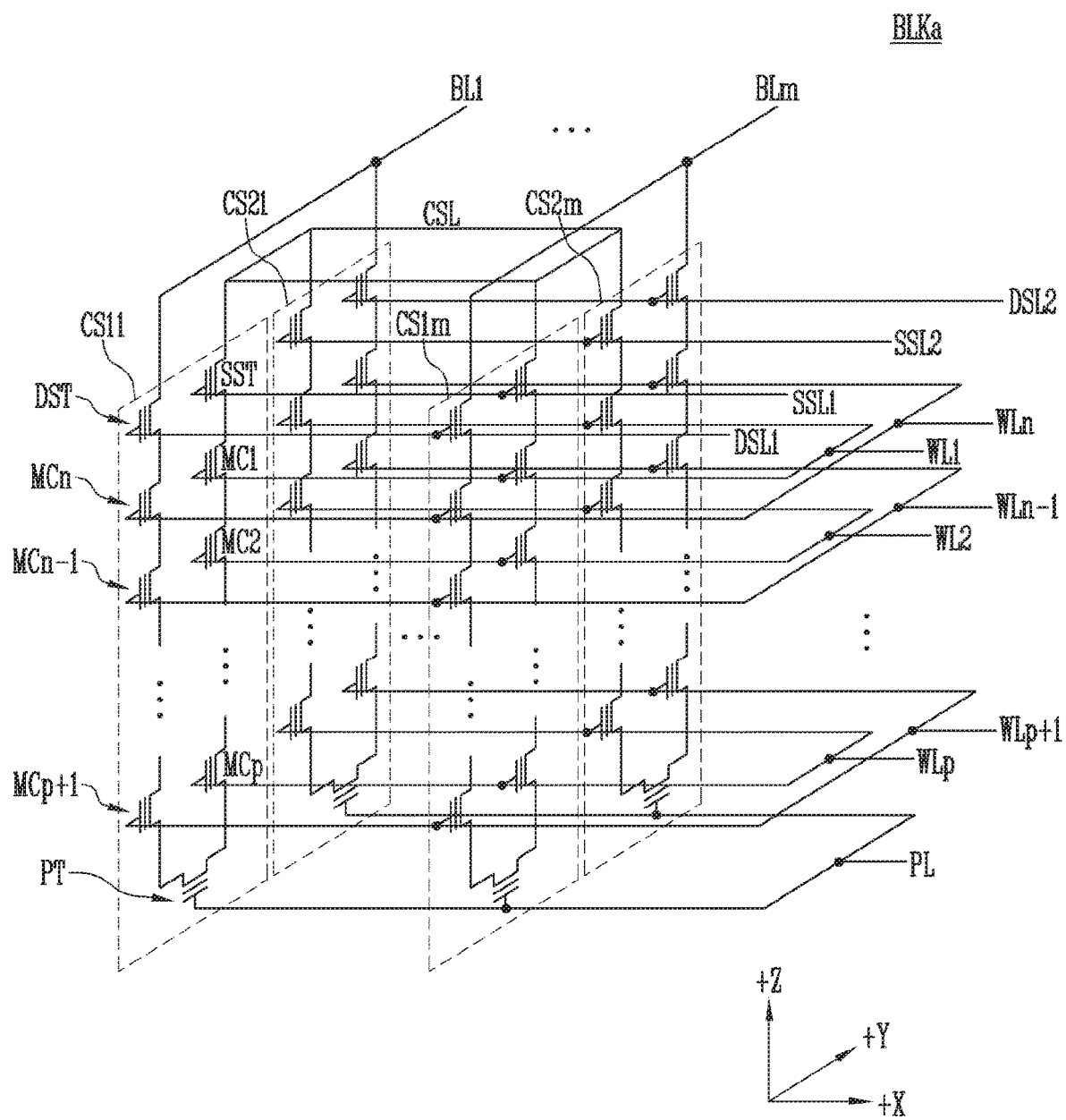
FIG. 4 is a circuit diagram illustrating a representative memory block BLKa of a plurality of memory blocks BLK1 to BLKz of FIG. 3.

FIG. 4 is a circuit diagram illustrating a representative memory block BLKa of a plurality of memory blocks BLK1 to BLKz of FIG. 3.

Referring to FIG. 4, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for clarity, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$nn$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a negative (−) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1$nn$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1$m$ and CS2$m$ in an m-th column are coupled to an m-th bit line BLm.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting one of the drain select lines DSL1 and DSL2. A single page may be selected from the selected cell strings by selecting one of the word lines WL1 to WLn.

In an embodiment, even bit lines and odd bit lines, instead of first to m-th bit lines BL1 to BLm, may be provided. The even-numbered cell strings, among the cell strings CS11 to CS1$m$ or CS21 to CS2$m$ arranged in a row direction, may be coupled to the even bit lines, respectively. The odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
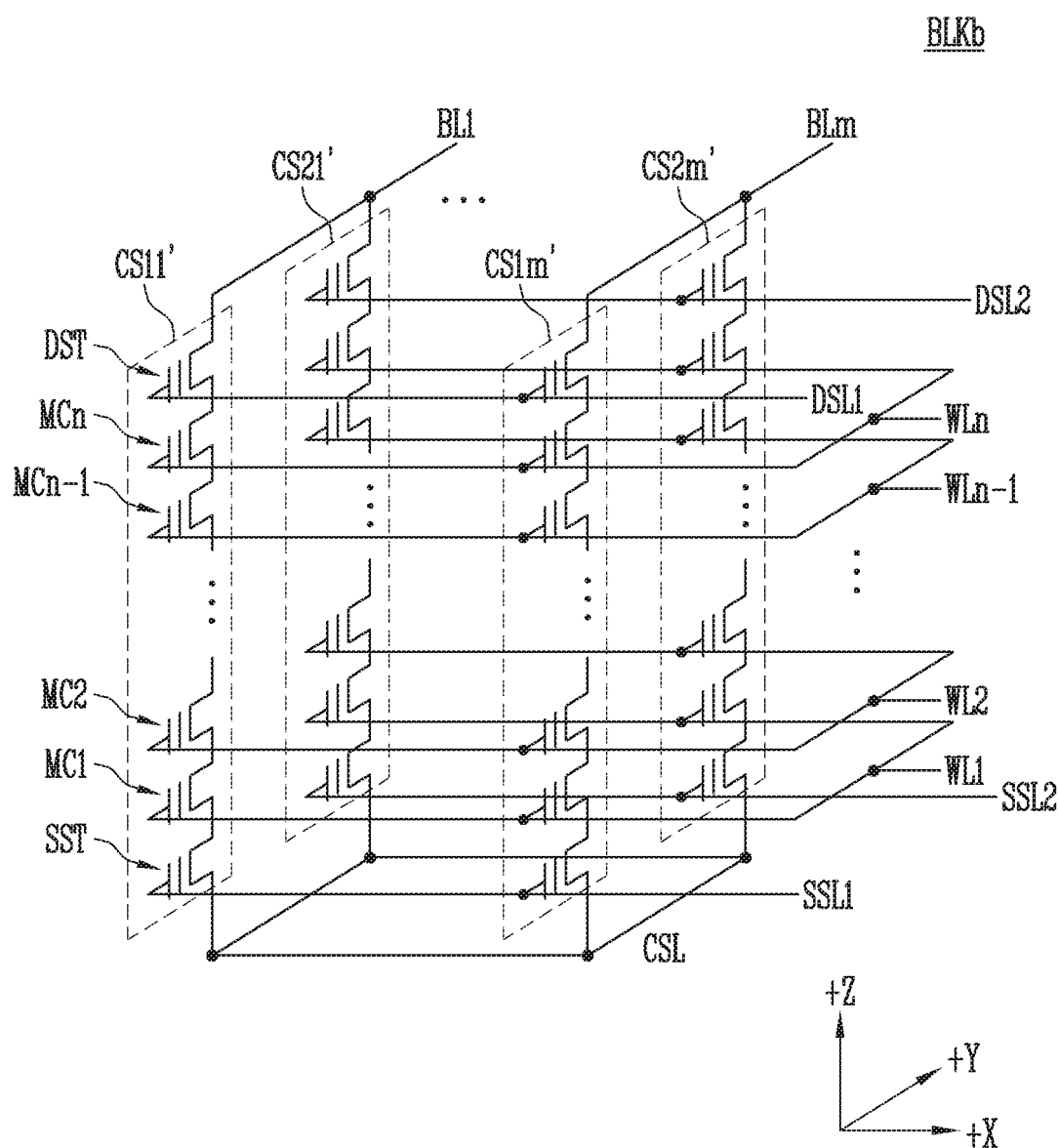
FIG. 5 is a circuit diagram illustrating a representative memory block BLKb of a plurality of memory blocks BLK1 to BLKz of FIG. 3.

FIG. 5 is a circuit diagram illustrating a representative memory block BLKb among a plurality of memory blocks BLK1 to BLKz of FIG. 3.

Referring to FIG. 5, the memory block BLKb may include a plurality of cell strings CS11' to CS1$m$' and CS21' to CS2$m$'. Each of the plurality of cell strings CS11' to CS1$m$' and CS21' to CS2$m$' is extended along a positive Z (+Z) direction. Each of the cell strings CS11' to CS1$m$' and CS21' to CS2$m$' may include at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1$m$' arranged in a first row are coupled to a first source select line SSL1. Source select transistors of cell strings CS21' to CS2$m$' arranged in a second row are coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1$m$' in the first row are coupled to a first drain select line DSL1. The drain select transistors of the cell strings CS21' to CS2$m$' in the second row are coupled to a second drain select line DSL2.

As a result, the memory block BLKb of FIG. 5 has a circuit structurally similar to that of the memory block BLKa of FIG. 4, except that a pipe transistor PT is excluded from each cell string.

In an embodiment, even bit lines and odd bit lines, instead of first to m-th bit lines BL1 to BLm, may be provided. The even-numbered cell strings, among the cell strings CS11' to CS1$m$' or CS21' to CS2$m$' arranged in a row direction, may be coupled to the even bit lines, respectively. The odd-numbered cell strings, among the cell strings CS11' to CS1$m$' or CS21' to CS2$m$' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 6:
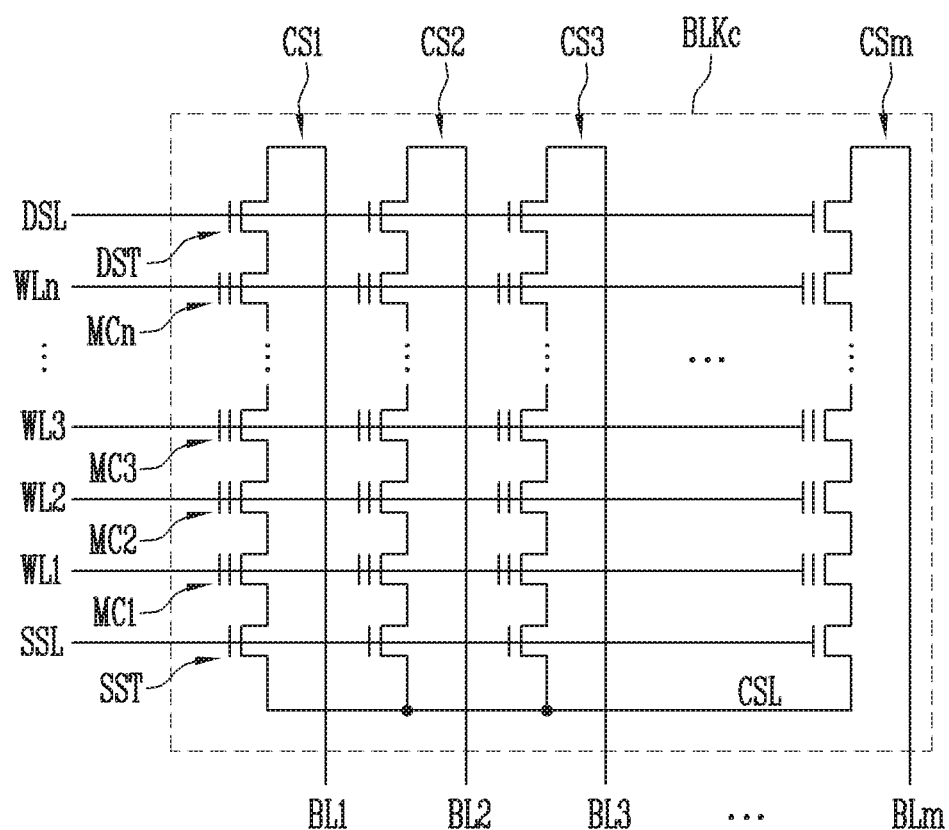
FIG. 6 is a circuit diagram illustrating a representative memory block BLKc of a plurality of memory blocks BLK1 to BLKz included in the memory cell array of FIG. 2.

FIG. 6 is a circuit diagram illustrating a representative memory block BLKc of a plurality of memory blocks BLK1 to BLKz in the memory cell array 110 of FIG. 2.

Referring to FIG. 6, the memory block BLKc may include a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

Figure 7:
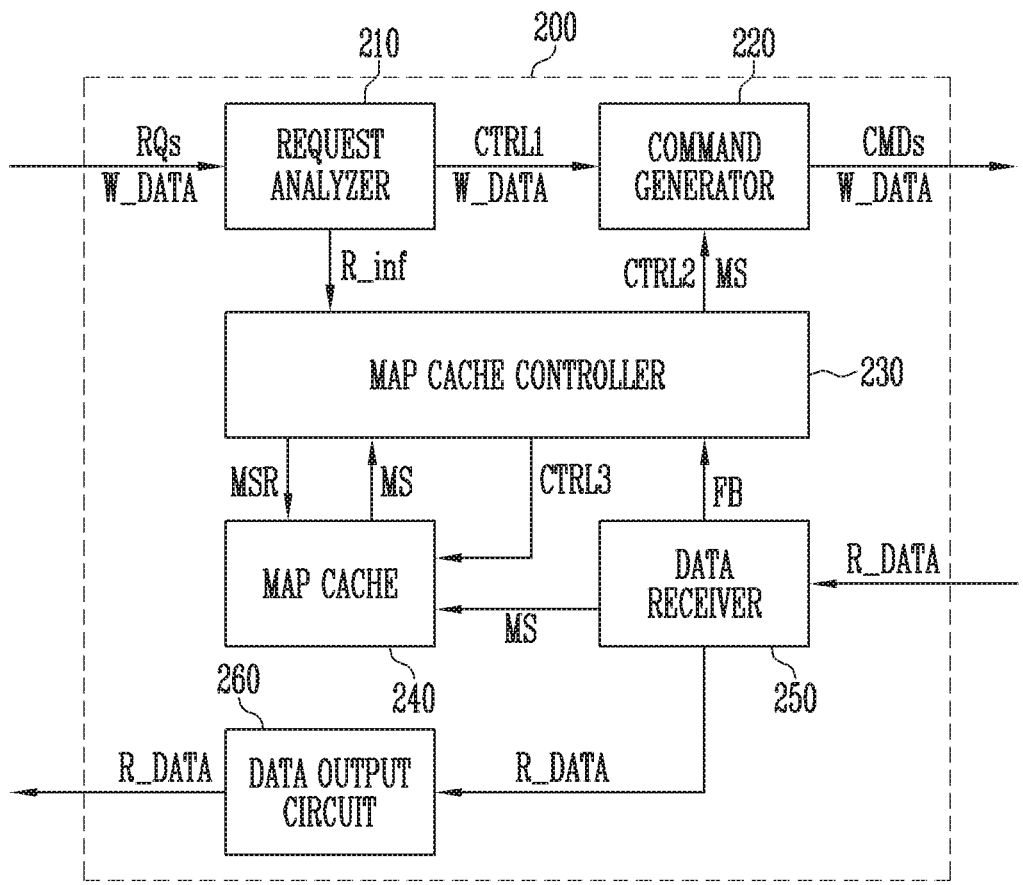
FIG. 7 is a block diagram illustrating a controller according to an embodiment of the present disclosure.

FIG. 7 is a block diagram illustrating the controller 200 according to an embodiment of the present disclosure.

Referring to FIG. 7, the controller 200 may include a request analyzer 210, a command generator 220, a map cache controller 230, a map cache 240, a data receiver 250, and a data output circuit 260.

Individual components of the controller 200 are described in detail below.

The request analyzer 210 may receive requests RQs and/or write data W_DATA from a host. The requests RQs may include a data write request, an update request, a read request, and an erase request. When a write request is received from the host, the controller 200 may receive the write data W_DATA together with the write request from the host. When an update request is received from the host, the controller 200 may also receive update data together with the update request from the host. The request analyzer 210 may analyze the received requests RQs and then transfer request information R_inf to the map cache controller 230. The request information R_inf may be used to control the map cache 240. The request analyzer 210 may transfer a first control signal CTRL1 for controlling the operation of the command generator 220 to the command generator 220 in response to the received requests RQs. When the write request or the update request is received from the host, the request analyzer 210 may transfer the received write data W_DATA, together with the request, to the command generator 220.

The command generator 220 may generate commands CMDs based on the first control signal CTRL1 from the request analyzer 210. Each of the generated commands may be a read command, a program command, or an erase command. The generated commands CMDs may be transferred to the semiconductor memory device 100. When the generated command is the program command, the command generator 220 may transfer the write data W_DATA, together with the program command, to the semiconductor memory device 100.

The command generator 220 may generate commands CMDs based on a second control signal CTRL2 from the map cache controller 230. The generated commands CMDs may relate to a mapping segment MS. For example, the commands CMDs may be a read command for reading a mapping segment MS stored in the semiconductor memory device 100 or a program command for programming a mapping segment MS to the semiconductor memory device 100. When the command CMD is the program command for programming a mapping segment MS, the map cache controller 230 may transfer a mapping segment MS that is the target to be programmed, together with the second control signal CTRL2, to the command generator 220. In this case, the command generator 220 may transfer the received mapping segment MS, as the write data W_DATA, to the semiconductor memory device 100.

In various embodiments, the mapping segment MS may represent a data unit including a plurality of mapping entries. Each of mapping entries may include data in which a logical address and a physical address of corresponding data are mapped to each other. The mapping segment MS and mapping entries included therein are described in detail below with reference to FIGS. 9A to 9C.

The map cache controller 230 may perform various operations related to a processing of the mapping segment MS. In an example, the map cache controller 230 may control the operation of the map cache 240 based on request information R_inf received from the request analyzer 210. When the request received by the request analyzer 210 is a data read request, the request analyzer 210 may transfer the request information R_inf including a logical address of the corresponding data to the map cache controller 230.

When the logical address in the request information R_inf is stored in the map cache 240 (this case is called "the occurrence of a cache hit"), the map cache controller 230 may transfer a mapping segment request MRS corresponding to the logical address to the map cache 240.

The map cache 240 may transfer a mapping segment MS corresponding to the received mapping segment request MRS to the map cache controller 230. The map cache controller 230 may extract a physical address, corresponding to the logical address in the request information R_inf, from the received mapping segment MS, and may transfer the physical address to the command generator 220. The command generator 220 may transfer the physical address received from the map cache controller 230, together with the read command, to the semiconductor memory device 100. Accordingly, the semiconductor memory device 100 may transfer read data R_DATA to the controller 200 through a read operation corresponding to the read command. The data receiver 250 may transmit the received read data R_DATA to the data output circuit 260. The data output circuit 260 may transfer the received read data R_DATA to the host.

When the logical address in the request information R_inf is not stored in the map cache 240 (which is sometimes referred to as a cache miss), a mapping segment MS including a mapping relationship between the corresponding logical address and a physical address should be read from the semiconductor memory device 100. For this operation, the map cache controller 230 may transmit the second control signal CTRL2 for reading the corresponding mapping segment to the command generator 220. The command generator 220 may generate a read command for reading the mapping segment MS in response to the second control signal CTRL2 and transfer the read command to the semiconductor memory device 100. In response to the read command, the semiconductor memory device 100 may transfer the read data R_DATA and the data receiver 250 may receive the read data R_DATA. The read data R_DATA may be a mapping segment that includes mapping information related to the logical address in the request information R_inf. The data receiver 250 may transmit the mapping segment MS corresponding to the received read data R_DATA to the map cache 240. The map cache 240 may store the received mapping segment MS and transmit the mapping segment MS to the map cache controller 230. The map cache controller 230 may extract a physical address, corresponding to the logical address in the request information R_inf, from the received mapping segment MS. The map cache controller 230 may transfer the physical address to the command generator 220. The command generator 220 may transfer the physical address from the map cache controller 230, together with the read command, to the semiconductor memory device 100. Accordingly, the semiconductor memory device 100 may transfer read data R_DATA to the controller 200 through a read operation corresponding to the read command. The data receiver 250 may transmit the received read data R_DATA to the data output circuit 260. The data output circuit 260 may transfer the received read data R_DATA to the host.

As described above, when the mapping segment MS corresponding to the logical address in the request information R_inf is stored in the map cache 240 (i.e., cache hit), the mapping segment MS may be loaded from the map cache 240, and a physical address for reading data may be immediately extracted. The extracted physical address, together with the read command, is transferred to the semiconductor memory device 100, so that the semiconductor memory device 100 may read the data requested by the host.

However, when a mapping segment MS corresponding to the logical address in the request information R_inf is not stored in the map cache 240 (i.e., cache miss), a mapping segment indicating a mapping relationship between the logical address and the physical address of the corresponding data should be primarily read before the data requested by the host is read. Accordingly, the semiconductor memory device 100 may primarily read the data including the mapping segment including the requested logical address and transfer the read data to the controller 200. The controller 200 may extract the physical address of data to be read from the received mapping segment and transfer the physical address, together with the read command, to the semiconductor memory device 100. Thereafter, an operation of reading the data requested by the host may be performed.

As compared with a cache hit, a cache miss additionally requires a procedure for reading a required mapping segment, and thus the overall read speed is deteriorated. Therefore, in order to improve the operation speed of a storage device including the semiconductor memory device 100 and the controller 200, when a data read request is received from the host, the probability of a cache hit should be increased for the mapping segment of the corresponding data.

The map cache 240 may be implemented as a static random access memory (SRAM) or a dynamic random access memory (DRAM). The capacity of the map cache 240 may be smaller than that of the memory cell array 110 in the semiconductor memory device 100. Since the capacity of the map cache 240 is small, mapping segments MS for all data stored in the memory cell array 110 cannot be stored, and only a part of the data may be stored. In this way, in order to increase a cache hit ratio of the mapping segment MS under the limited capacity of the map cache 240, there is a need to efficiently use the map cache 240.

In various embodiments, the map cache 240 may separate a mapping segment for random data and a mapping segment for sequential data, and may separately store the mapping segments. For this operation, when a mapping segment is stored in the semiconductor memory device 100, whether data stored in the corresponding mapping segment is of a particular characteristic, i.e., is sequential data or random data, may be indicated through a flag bit FB. Thereafter, when the controller 200 loads a specific mapping segment into the map cache 240, whether data corresponding to the mapping segment from the semiconductor memory device 100 is sequential data or random data may be determined based on the flag bit FB of the received mapping segment. Thereafter, depending on the results of classification, the mapping segment may be identified and stored in the map cache 240.

In the case of sequential data, a start address corresponding to the start location of the sequential data and the data length of the sequential data may be stored without needing to store all of mapping entries, and thus a capacity required for caching of the mapping segment may be remarkably reduced. Accordingly, in accordance with an embodiment of the present disclosure, as much mapping data as possible may be included in the map cache by efficiently using the limited capacity of the map cache 240 in the controller 200, thus enabling the operation speed of the storage device 1000 to be improved.

Figure 8:
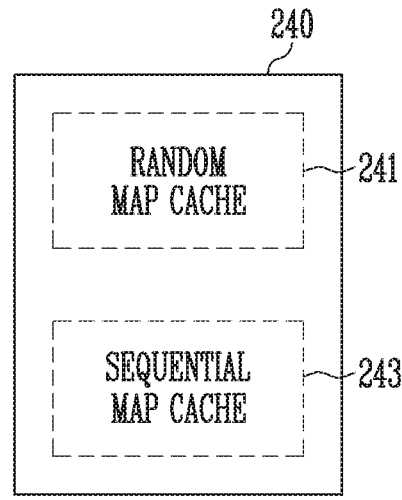
FIG. 8 is a block diagram illustrating an example of a map cache of FIG. 7.

FIG. 8 is a block diagram illustrating an example of the map cache 240 of FIG. 7.

Referring to FIG. 8, the map cache 240 may include a random map cache 241 and a sequential map cache 243. The random map cache 241 may store a mapping segment MS corresponding to random data. The sequential map cache 243 may store a mapping segment MS corresponding to sequential data.

There are two cases where the mapping segment MS is stored in the map cache 240.

As a first case where a mapping segment MS is stored in the map cache 240, in a case where data is programmed to the memory device 100, a mapping segment MS for program data may be internally generated by the controller 200 and then stored in the map cache 240. In an example, the map cache controller 230 or the command generator 220 may generate a mapping segment MS. In this case, the map cache controller 230 may determine, in advance, whether data corresponding to the generated mapping segment MS, that is, write data (or program data), is sequential data or random data. When the write data is random data, the map cache controller 230 may store the generated mapping segment MS in the random map cache 241 by controlling the map cache 240 in response to a third control signal CTRL3. When the write data is sequential data, the map cache controller 230 may store the generated mapping segment MS in the sequential map cache 243 by controlling the map cache 240 in response to the third control signal CTRL3.

The generated mapping segment MS may also be transferred and programmed to the semiconductor memory device 100. In this case, the command generator 220 may insert a flag bit FB, which indicates whether data corresponding to the generated mapping segment MS is sequential data or random data, into the mapping segment MS. Further, the command generator 220 may transfer the resulting mapping segment MS to the semiconductor memory device 100. The semiconductor memory device 100 may program the mapping segment MS into which the flag bit FB is inserted.

As a second case where a mapping segment MS is stored in the map cache 240, in a case where the host transfers a read request to the controller 200 and a mapping segment corresponding to the read request is not stored in the map cache (i.e., in the event of a cache miss), a read command for reading the corresponding mapping segment MS is transferred to the semiconductor memory device 100. The read data R_DATA corresponding to the received read command is received by the data receiver 250. The data receiver 250 transfers the value of a flag bit FB of the mapping segment MS, received as the read data R_DATA, to the map cache controller 230 and transfers the mapping segment MS to the map cache. The flag bit FB indicates whether the data corresponding to the received mapping segment MS is sequential data or random data. Therefore, the map cache controller 230 may check the flag bit FB, and may control the map cache 240 so that the mapping segment MS is stored in the random map cache 241 in response to the third control signal CTRL3 when the data corresponding to the received mapping segment MS is random data. Also, the map cache controller 230 may check the flag bit FB, and may control the map cache 243 so that the mapping segment MS is stored in the sequential map cache 243 in response to the third control signal CTRL3 when the data corresponding to the received mapping segment MS is sequential data.

In this way, when the generated mapping segment MS is stored in the semiconductor memory device 100, the flag bit FB indicating the mapping segment MS is random data or sequential data may be stored together with the mapping segment MS. Further, when a mapping segment MS is read from the semiconductor memory device 100 in the event of a cache miss, the read mapping segment MS is stored in the random map cache 241 or the sequential map cache 243 based on the value indicated by the flag bit FB. Accordingly, the operating performance of the storage device 1000 may be improved by efficiently using the capacity of the map cache 240 in the controller 200.

FIGS. 9A, 9B, and 9C are diagrams illustrating a mapping segment stored in a semiconductor memory device according to an embodiment of the present disclosure.

Referring to FIG. 9A, a mapping segment includes a plurality of mapping entries ME1 to MEk and a flag bit FB.

Each of the plurality of mapping entries ME1 to MEk may be data indicating a mapping relationship between a logical address and a physical address of data. In an example, each of the plurality of mapping entries ME1 to MEk may be data indicating a mapping relationship between a logical address and a physical address of data in a page unit. For example, the first mapping entry ME1 may be data indicating logical and physical addresses of data in a single specific page.

Such a mapping segment MS may be generated by the controller 200 when data is newly programmed to the semiconductor memory device 100 or when updated data is programmed to the semiconductor memory device 100 in response to requests RQs from the host. The controller 200 may generate a flag bit FB depending on whether the corresponding data is sequential data or random data, and may cause the flag bit FB to be included in the mapping segment MS. The mapping segment MS including the flag bit FB may be transferred and programmed to the semiconductor memory device 100.

FIG. 9B is a diagram illustrating the generation of a mapping segment corresponding to random data. In FIG. 9B, among individual mapping entries ME1 to MEk, mapping entries corresponding to sequential data are shown as hatched regions. That is, pieces of data corresponding to a first mapping entry ME1 and a second mapping entry ME2 may be pieces of random data which do not have a sequential (or consecutive) relationship therebetween. In contrast, pieces of data corresponding to a third mapping entry ME3 to a fifth mapping entry ME5 are pieces of sequential data which indicate consecutive logical addresses and physical addresses. Similarly, eighth to j-th mapping entries ME8 to MEj may also be mapping entries corresponding to sequential data.

Although the mapping segment MS illustrated in FIG. 9B includes mapping entries with some consecutive data, the mapping segment MS also includes mapping entries corresponding to random data. Therefore, since at least some mapping entries indicate random locations, the value of the flag bit FB is set to a value of '0'.

Referring to FIG. 9C, all mapping entries ME1 to MEk in a mapping segment indicate consecutive locations. Since all mapping entries ME1 to MEk of the mapping segment illustrated in FIG. 9C correspond to a single piece of sequential data, the value of the flag bit FB is set to a value of '1'.

Referring to FIGS. 9B and 9C, when data corresponding to the mapping segment MS is random data, the value of the flag bit FB is set to '0'. When data corresponding to the mapping segment MS is sequential data, the value of the flag bit FB is set to '1'. However, the present disclosure is not limited to this convention. The opposite convention may be used. That is, a flag bit of '0' may indicate a mapping segment MS with all sequential data, while a flag bit of '1' may indicate a mapping segment MS with at least some random data.

Figure 10:
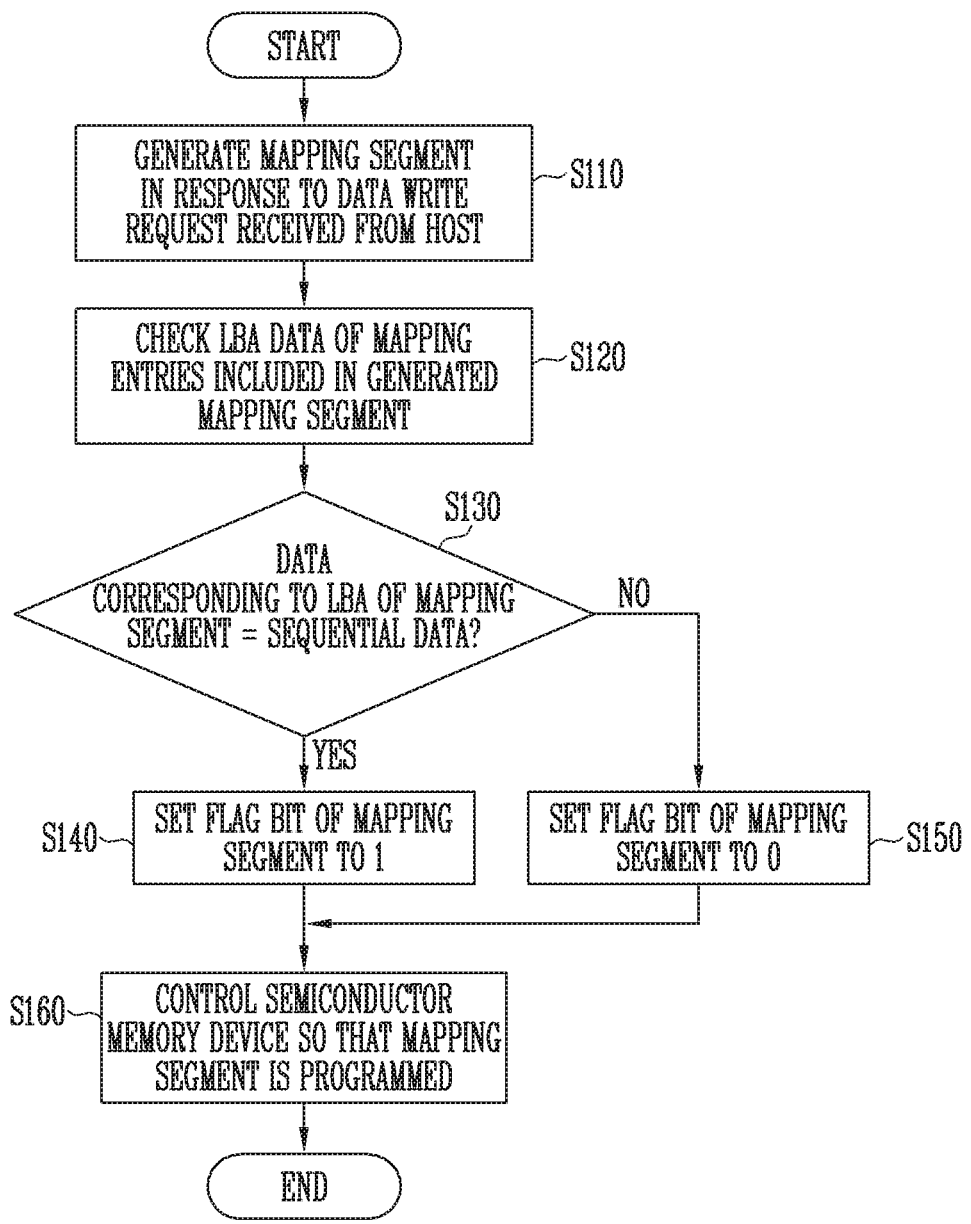
FIG. 10 is a flowchart illustrating a process for generating a mapping segment and programming the mapping segment to a semiconductor memory device according to an embodiment of the present disclosure.

FIG. 10 is a flowchart illustrating a method of operating a controller according to an embodiment of the present disclosure. The method may include a process for generating a mapping segment and programming the mapping segment to a semiconductor memory device. Such method is described with reference to FIGS. 7 to 10.

Referring to FIG. 10, a mapping segment MS is generated in response to a data write request received from a host at step S110. At step S110, the request analyzer 210 may receive the write request and write data from the host. Further, the request analyzer 210 may transfer request information R_inf corresponding to the write request to the map cache controller 230. The map cache controller 230 may generate a mapping segment MS based on the request information R_inf. It is illustrated at step S110 of FIG. 10 that the mapping segment is generated in response to the write request from the host. Alternatively, a mapping segment may be generated in response to an update request received from the host. In this case, the generated mapping segment may include a mapping relationship between a logical address and a physical address of the updated data. In an embodiment, a mapping segment may be generated without receiving a request from the host. For example, when a garbage collection operation on the semiconductor memory device 100 is internally performed in the storage device 1000, a read operation and a program operation are performed on the semiconductor memory device 100 without receiving a request from the host. In this case, there is a need to newly generate a mapping segment through the garbage collection operation. Therefore, at step S110, a mapping segment may be generated without receiving an explicit request from the host.

Thereafter, data about logical block address (LBA) of the mapping entries in the generated mapping segment MS may be checked at step S120. Step S120 may be performed by the map cache controller 230. That is, the map cache controller 230 may receive request information R_inf from the request analyzer 210 and check the LBA data in the request information R_inf.

Thereafter, it is determined whether data corresponding to the logical block address of the generated mapping segment MS is sequential data at step S130. Step S130 may also be performed by the map cache controller 230. That is, the map cache controller 230 may determine, based on the LBA data in the request information R_inf, whether mapping entries in the mapping segment MS include logical addresses corresponding to a single piece of sequential data or include logical addresses corresponding to random data.

When data corresponding to the logical block address of the mapping segment MS is sequential data (i.e., in case of Yes at step S130), the flag bit FB of the mapping segment is set to a value of '1' at step S140. As illustrated in FIG. 9C, when all mapping entries in the mapping segment MS indicate consecutive logical addresses, data corresponding to the mapping segment MS may be a single piece of sequential data. Therefore, in this case, the flag bit FB is set to a value of '1'. Step S140 may be performed by the map cache controller 230.

When data corresponding to the logical block address of the mapping segment MS is random data (i.e., in case of No at step S130), the flag bit FB of the mapping segment is set to '0' at step S150. As illustrated in FIG. 9B, when at least some of the mapping entries in the mapping segment MS indicate random locations, data corresponding to the mapping segment MS may be determined to be random data. Therefore, in this case, the flag bit FB is set to '0'. Step S150 may be performed by the map cache controller 230.

Thereafter, the semiconductor memory device 100 is controlled so that the mapping segment MS in which the value of the flag bit FB has been set is programmed to the semiconductor memory device 100 at step S160. At step S160, the map cache controller 230 may transfer the mapping segment MS to the command generator 220. The mapping segment MS includes the flag bit FB that is set to '1' or '0' at step S140 or S150. The command generator 220 transfers the received mapping segment MS as write data W_DATA, together with a program command, to the semiconductor memory device 100. Accordingly, the semiconductor memory device 100 may program the received mapping segment.

In this way, in various embodiments, the semiconductor memory device 100 may be controlled such that a mapping segment including a flag bit FB, which indicates whether the mapping segment is random data or sequential data, is generated depending on the type of data and is then programmed to the memory cell array of the semiconductor memory device 100.

Figure 11:
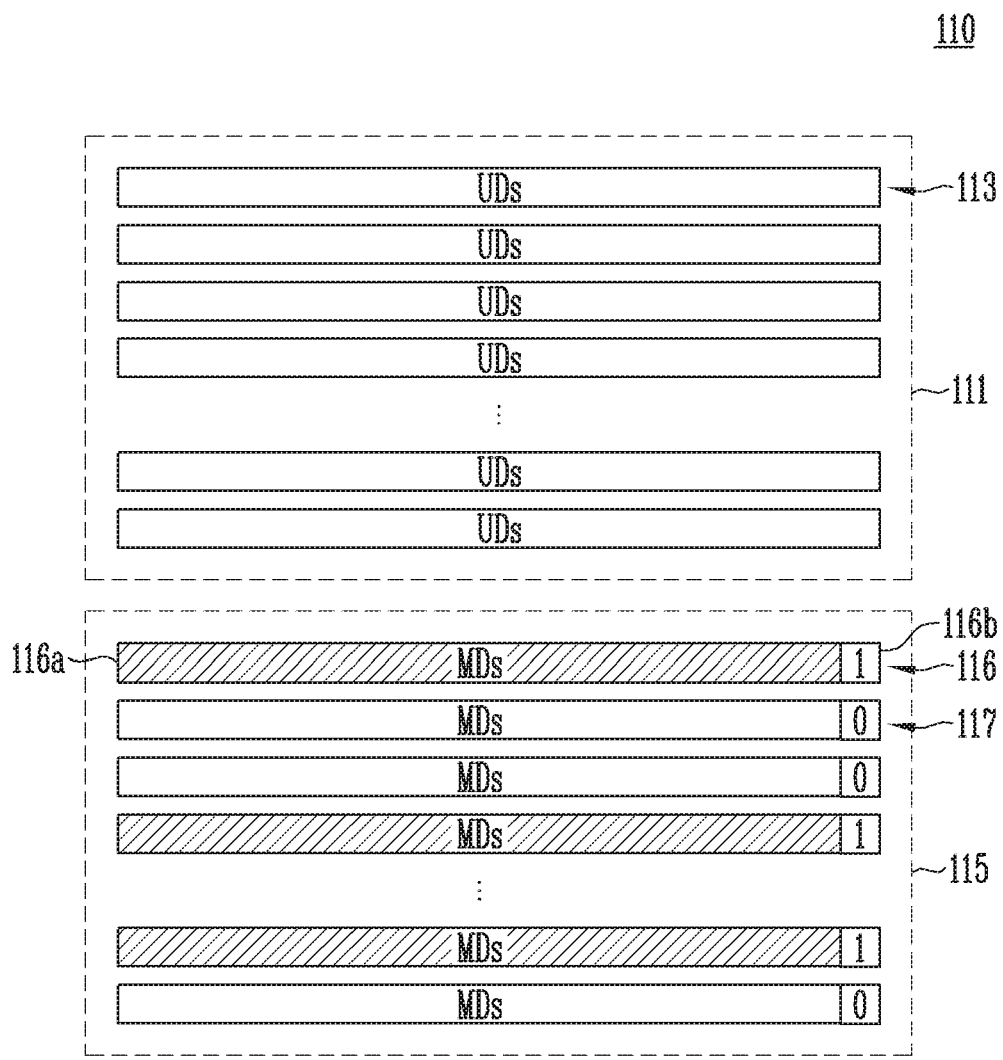
FIG. 11 is a diagram illustrating a mapping segment programmed to the memory cell array of the semiconductor memory device using the process of FIG. 10.

FIG. 11 is a diagram illustrating a mapping segment programmed to the memory cell array 110 of the semiconductor memory device using the process of FIG. 10.

Referring to FIG. 11, the memory cell array 110 may include a user area 111 and a reserved area 115. The user area 111 may store write data received from the host, that is, user data. The reserved area 115 may store data required in order to operate the storage device 1000, in addition to the above-described user data. In an embodiment, a mapping table may be stored in the reserved area 115. The mapping table may store mapping data between respective logical-to-physical addresses for all pieces of user data (UDs) 113 stored in the user area 111. The mapping table may store a plurality of mapping segments including mapping segments 116 and 117.

Each of the plurality of mapping segments in the reserved area 115 may have the structure of the mapping segment illustrated in FIGS. 9A to 9C. For example, the mapping segment 116 may include mapping data (MDs) 116a and a flag bit (FB) 116b. The mapping data MDs may include mapping entries ME1 to MEk illustrated in FIGS. 9A to 9C. In FIG. 11, when all mapping entries indicate consecutive locations, the corresponding mapping data MDs is indicated as a hatched region. When at least some of the mapping entries indicate random locations, the corresponding mapping data MDs is not indicated as a hatched region. As illustrated in FIG. 11, when all mapping entries indicate consecutive locations, the flag bit FB corresponding to the mapping segment has a value of 1. When at least some mapping entries indicate random locations, the flag bit FB corresponding to the mapping segment has a value of '0'. As illustrated in FIG. 11, each of mapping segments stored in the memory cell array 110 includes a flag bit FB indicating whether data corresponding to the relevant mapping segment is sequential data or random data.

Figure 12A:
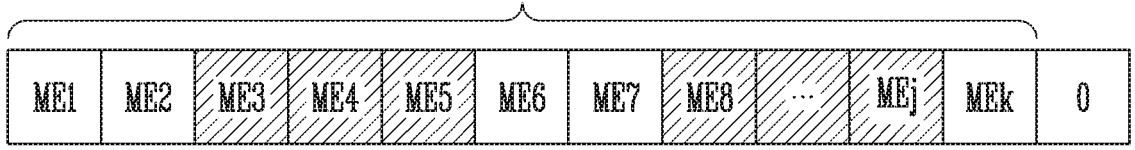
FIGS. 12A and 12B are diagrams illustrating a method of storing a mapping segment read from a semiconductor memory device in a map cache of a controller according to an embodiment of the present disclosure.
Figure 12A:
Figure 12B:
Figure 12B:

FIGS. 12A and 12B are diagrams illustrating a method of storing a mapping segment read from a semiconductor memory device in a map cache of a controller according to an embodiment of the present disclosure.

As described above, when a mapping segment MS corresponding to a read request from the host is not stored in the map cache 240 (i.e., in the event of a cache miss), the semiconductor memory device 100 reads the corresponding mapping segment MS and transfers it to the controller 200, and the controller 200 stores the received mapping segment in the map cache 240. Further, the controller 200 generates a read command based on the received mapping segment MS, and transfers it to the semiconductor memory device 100.

As illustrated in FIG. 12A, a case where the flag bit FB of the mapping segment MS received from the semiconductor memory device 100 is a value of '0' may mean that at least some mapping entries indicate random locations. Therefore, in this case, the controller 200 stores the received mapping segment MS in the random map cache 241. When the mapping segment MS is stored in the random map cache 241, the mapping entries ME1 to MEk in the mapping segment MS are stored in the random map cache 241 without change.

As illustrated in FIG. 12B, a case where the flag bit FB of the mapping segment MS received from the semiconductor memory device 100 is '1' may mean that all mapping entries indicate consecutive locations. Therefore, in this case, the controller 200 stores the received mapping segment MS in the sequential map cache 243. In this case, there is no need to store all mapping entries ME1 to MEk in the mapping segment MS. Since the mapping entries ME1 to MEk indicate consecutive locations of the sequential data, the locations of all of the sequential data may be known from only the start location and data length of the corresponding sequential data. In an embodiment, the start location of the sequential data may correspond to the physical page number (PPN) of the corresponding data. The data length may correspond to 1024 pages. In an example of FIG. 12B, the value of k may be 1024. Accordingly, the controller 200 may store, in the sequential map cache 243, sequential map data SMD and the data length of the sequential data. The sequential map data SMD represents a mapping relationship between the start logical address and start physical address of sequential data indicated by the mapping segment MS. In an embodiment, a single piece of sequential map data SMD may include information about 1024 physical pages. For example, sequential map data SMD corresponding to the first mapping entry ME1 and the entire length of the data indicated by the first to k-th mapping entries ME1 to MEk may be generated. The sequential map data SMD represents a mapping relationship between the logical address and physical address indicated by the first mapping entry MEL Further, the sequential map data SMD and the entire length of the data may be stored in the sequential map cache 243. In the case of FIG. 12A, all mapping entries are stored in the random map cache 241. In contrast, in the case of FIG. 12B, the mapping segment MS of the sequential data is converted into sequential map data SMD and then sequential map data SMD is stored in the sequential map cache 243. In the case of FIG. 12B, mapping data corresponding to data having the same size may be cached while the capacity of the map cache to be used is greatly decreased. Therefore, the capacity of the map cache 240 may be efficiently used.

Figure 13:
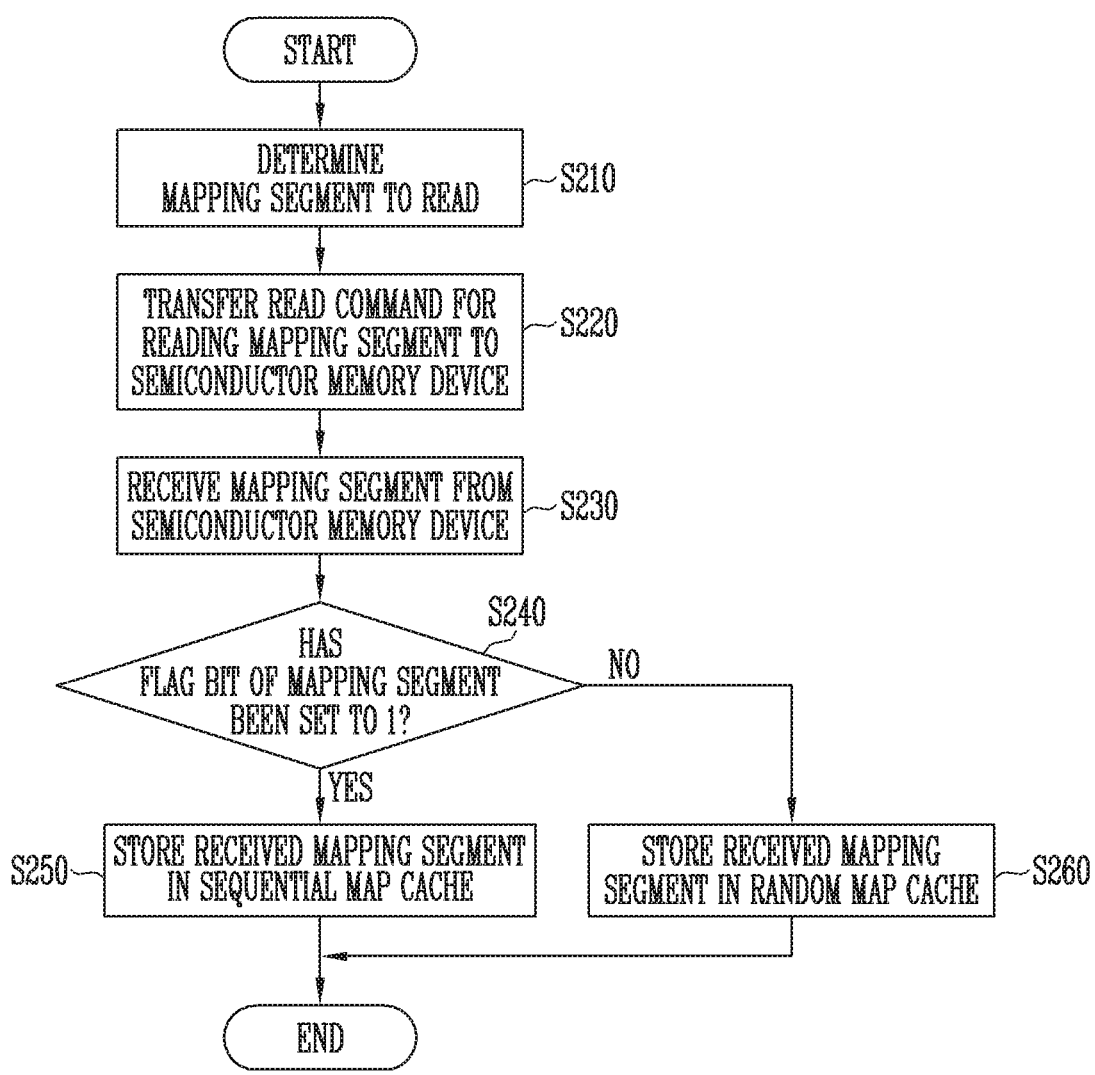
FIG. 13 is a flowchart illustrating a method of reading a mapping segment and storing the mapping segment in a map cache according to an embodiment of the present disclosure.

FIG. 13 is a flowchart illustrating a method of operating a controller according to an embodiment of the present disclosure. The method of operating the controller includes reading a mapping segment and storing the mapping segment in a map cache. Such method is described in detail with reference to FIGS. 7, 8, 12A, 12B, and 13 together.

Referring to FIG. 13, first, the controller may determine a mapping segment to read at step S210. As described above, step S210 may be performed when a cache miss occurs on the mapping segment. That is, when the request analyzer 210 receives a data read request from the host and transfers request information R_inf to the map cache controller 230, and a mapping segment MS corresponding to the read request is not present in the map cache 240, the map cache controller 230 may determine to read the corresponding mapping segment MS from the semiconductor memory device 100.

A read command for reading the cache-missed mapping segment is transferred to the semiconductor memory device at step S220. At step S220, the map cache controller 230 may transfer a second control signal CTRL2 to the command generator 220. The command generator 220 may generate a read command for reading a mapping segment MS in response to the received second control signal CTRL2 and transmit the read command to the semiconductor memory device 100.

Thereafter, the controller 200 may receive the mapping segment MS from the semiconductor memory device 100 at step S230. In response to the read command transferred at previous step S220, the semiconductor memory device 100 may read a mapping segment corresponding to the received read command from mapping segments stored in the reserved area 115 of FIG. 11. Further, the semiconductor memory device 100 may transfer the read mapping segment to the controller 200. The corresponding mapping segment is received as read data R_DATA by the data receiver 250.

Thereafter, at step S240, the controller 200 may determine whether the flag bit FB of the received mapping segment has been set to a value of '1'. After the data receiver 250 receives the mapping segment MS as the read data R_DATA at step S230, the data receive 250 may transfer a value of the flag bit FB of the corresponding mapping segment MS to the map cache controller 230. At step S240, the map cache controller 230 may receive the flag bit FB, and may determine whether the value of the flag bit FB has been set to '1'.

When it is determined that the flag bit FB of the mapping segment has been set to '1' (i.e., in case of Yes at step S240), the controller 300 may store the received mapping segment MS in the sequential map cache 243 at step S250. At step S250, the data receiver 250 may transfer the mapping segment MS received as the read data R_DATA to the map cache 240. The map cache controller 230 may control the map cache 240 so that the received mapping segment MS is stored in the sequential map cache 243 in response to a third control signal CTRL3. Under the control of the map cache controller 230, as illustrated in FIG. 12B, the map cache 240 may generate sequential map data SMD based on the mapping entries of the received mapping segment MS, and may store the generated sequential map data in the sequential map cache 243.

When it is determined that the flag bit FB of the mapping segment has been set to '0' (i.e., in case of No at step S240), the controller 300 may store the received mapping segment MS in the random map cache 241 at step S260. At step S260, the data receiver 250 may transfer the mapping segment MS received as the read data R_DATA to the map cache 240. The map cache controller 230 may control the map cache 240 so that the received mapping segment MS is stored in the random map cache 241 in response to the third control signal CTRL3. Under the control of the map cache controller 230, as illustrated in FIG. 12A, the map cache 240 may store mapping entries ME1 to MEk of the received mapping segment MS in the random map cache 241.

Although not illustrated in FIG. 13, the method of operating the controller according to an embodiment of the present disclosure may further include, after step S250 or S260, the step of controlling the semiconductor memory device 100 so that a read operation based on the received mapping segment is performed. In this case, the map cache controller 230 may control the command generator 220 so that a read command for reading data corresponding to the mapping segment is generated based on the mapping segment stored in the map cache 240. In this case, depending on the features of data corresponding to the mapping segment, the map cache 240 may store the mapping segment in the random map cache 241 or the sequential map cache 243. When data corresponding to the mapping segment is random data, the random map cache 241 may store a plurality of mapping entries corresponding to the mapping segment. In contrast, when the data corresponding to the mapping segment is sequential data, the sequential map cache 243 may store sequential map data corresponding to the mapping segment. The map cache controller 230 may control the command generator 220 so that a read command for reading data corresponding to the mapping segment is generated based on data stored in the random map cache 241 or the sequential map cache 243.

As described above, in various embodiments, the mapping entries ME1 to MEk of the received mapping segment MS may be stored in the random map cache 241 based on the value of the flag bit FB of the mapping segment MS received from the semiconductor memory device 100. Alternatively, the sequential map data SMD may be generated based on the mapping entries ME1 to MEk and then be stored in the sequential map cache 243. Accordingly, the storage capacity of the map cache 240 of the controller 200 may be more efficiently used and, as a result, the operation speed of the storage device 1000 including the controller 200 and the semiconductor memory device 100 may be improved. In addition, since the cache hit ratio of the mapping segment is increased by efficiently using the storage capacity of the map cache 240, the number of read operations on the reserved area 115 of the memory cell array 110 may be reduced. Accordingly, the lifespan and operating reliability of the semiconductor memory device 100 including the memory cell array 110 may also be improved.

Figure 14:
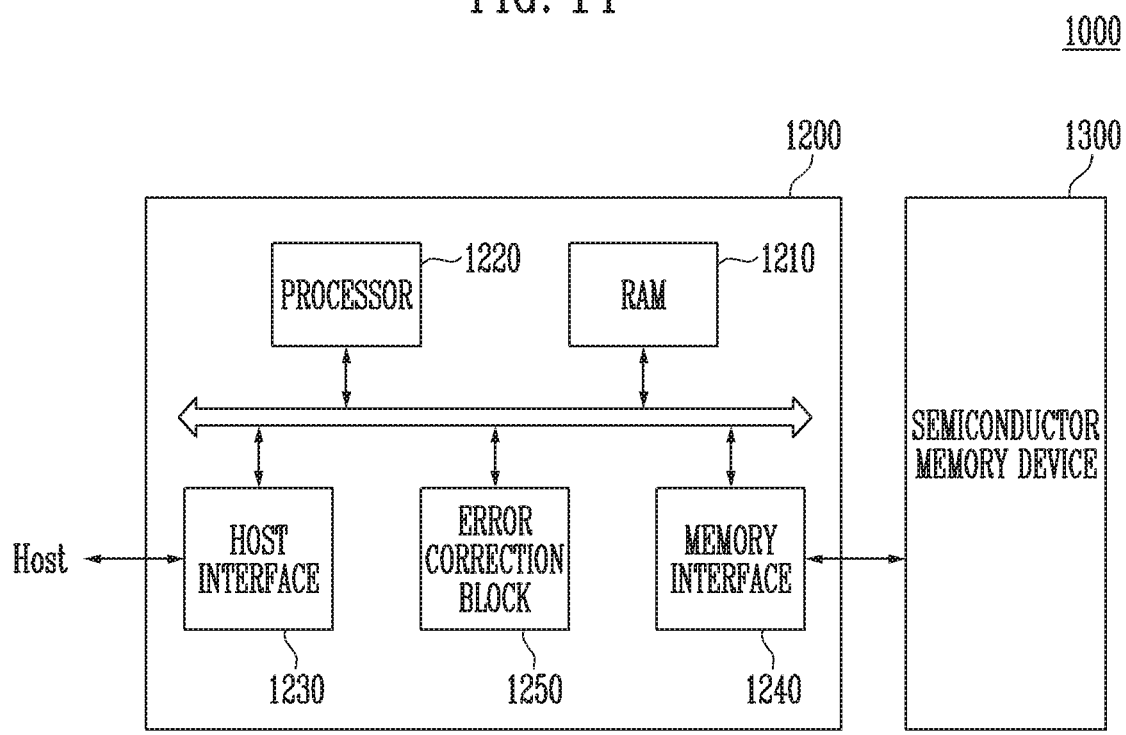
FIG. 14 is a block diagram illustrating an example of the controller of FIG. 1.

FIG. 14 is a block diagram illustrating an example of a storage device 1000.

Referring FIG. 14, a storage device 1000 includes a controller 1200 and a semiconductor memory device 1300. The semiconductor memory device 1300 may correspond to the semiconductor memory device 100 shown in FIG. 2, and the controller 1200 may correspond to the controller 200 shown in FIG. 7.

The semiconductor memory device 1300 of FIG. 14 may have the same configuration and operation as the semiconductor memory device 100, described above with reference to FIG. 2.

The controller 1200 is coupled to a host (Host) and the semiconductor memory device 1300. The controller 1200 is configured to access the semiconductor memory device 1300 in response to a request from the host. For example, the controller 1200 is configured to control read, write, erase, and background operations of the semiconductor memory device 1300. The controller 1200 is configured to provide an interface between the host and the semiconductor memory device 1300. The controller 1200 is configured to run firmware for controlling the semiconductor memory device 1300.

The controller 1200 includes a random access memory (RAM) 1210, a processor 1220, a host interface 1230, a memory interface 1240, and an error correction block 1250.

The RAM 1210 is used as a work memory of the processor 1220, a cache memory between the semiconductor memory device 1300 and the host, and/or a buffer memory between the semiconductor memory device 1300 and the host.

The RAM 1210 may be implemented as the map cache 240 illustrated in FIG. 7.

The processor 1220 controls the overall operation of the controller 1200. The processor 1220 may control read, program, erase, and background operations of the semiconductor memory device 1300. The processor 1220 may run firmware for controlling the semiconductor memory device 1300. The processor 1220 may perform a function of a flash translation layer (FTL). The processor 1220 may translate a logical block address (LBA), provided by the host, into a physical block address (PBA) through the FTL. The FTL may receive the LBA and translate the LBA into the PBA using a mapping table. Examples of an address mapping method performed through the FTL may include any of various methods according to a mapping unit. Representative address mapping methods include a page mapping method, a block mapping method, and a hybrid mapping method.

The processor 1220 may randomize data received from the host Host. For example, the processor 1220 may use a randomizing seed to randomize data received from the host Host. The randomized data is provided, as data to be stored, to the semiconductor memory device 1300 and is then programmed to the memory cell array.

The processor 1220 may derandomize data received from the semiconductor memory device 1300 during a read operation. For example, the processor 1220 may use a derandomizing seed to derandomize data received from the semiconductor memory device 1300. Derandomized data may be output to the host Host.

In an embodiment, the processor 1220 may run software or firmware to perform the randomizing or derandomizing operation.

The processor 1220 may be implemented as the map cache controller 230 and the command generator 220, illustrated in FIG. 7.

The host interface 1230 includes a protocol for performing data exchange between the host Host and the controller 1200. In an embodiment, the controller 1200 may communicate with the host through at least one of various interface protocols, such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and/or a private protocol.

The host interface 1230 may be implemented as the request analyzer 210 and the data output circuit 260 illustrated in FIG. 7.

The memory interface 1240 may interface with the semiconductor memory device 1300. For example, the memory interface 1240 includes a NAND interface or a NOR interface.

The memory interface 1240 may be implemented as the data receiver 250 illustrated in FIG. 7.

The error correction block 1250 is configured to use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 may output error-corrected page data to the host.

The controller 1200 and the semiconductor memory device 1300 may be integrated into a single semiconductor device. For example, the controller 1200 and the semiconductor memory device 1300 may be so integrated to form a memory card, such as a personal computer memory card international association (PCMCIA), a compact flash card (CF), a smart media card (e.g., SM or SMC), a memory stick, a multimedia card (e.g., MMC, RS-MMC, or MMC-micro), a secure digital (SD) card (e.g., SD, miniSD, microSD, or SDHC), or a universal flash storage (UFS).

The controller 1200 and the semiconductor memory device 1300 may be integrated into a single semiconductor device to form a solid state drive (SSD). The solid state drive (SSD) may include a storage device configured to store data in a semiconductor memory. When the storage device is used as the SSD, the operation speed of the host coupled to the storage device may be remarkably improved.

In an embodiment, the storage device may be provided as any of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the storage device 1000 may be embedded in any of various types of packages. For example, the semiconductor memory device 1300 or the storage device 1000 may be packaged as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 15:
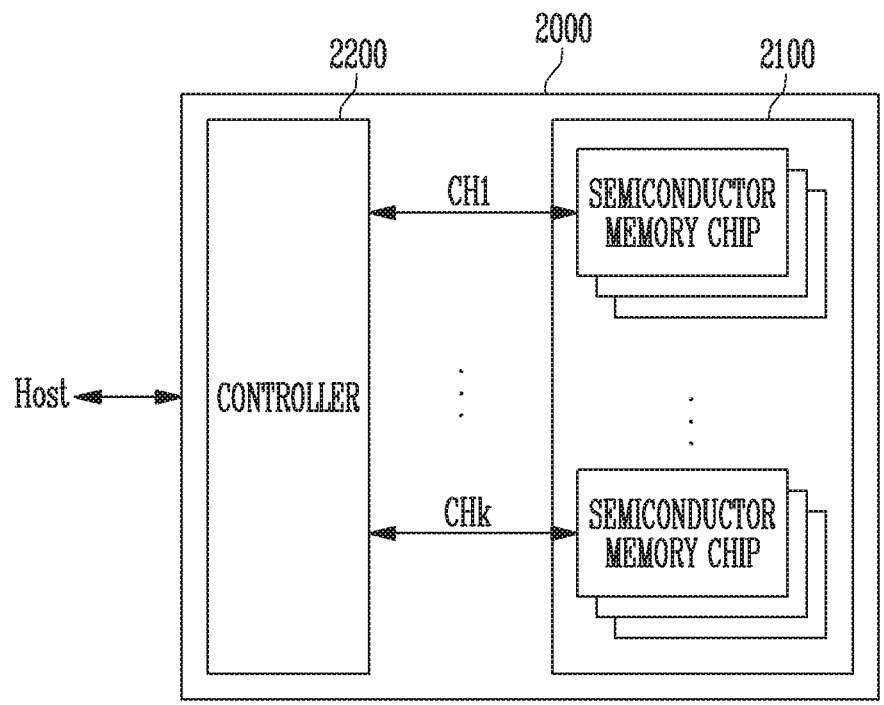
FIG. 15 is a block diagram illustrating an example of application of the storage device of FIG. 1.

FIG. 15 is a block diagram illustrating a memory system 2000, which is an example of application of the storage device 1000 of FIG. 14.

Referring to FIG. 15, the storage device 2000 includes a semiconductor memory device 2100 and a controller 2200. The semiconductor memory device 2100 includes a plurality of semiconductor memory chips. The semiconductor memory chips are divided into a plurality of groups.

In FIG. 15, it is illustrated that each of the plurality of, i.e., k, groups communicates with the controller 2200 through first to k-th channels CH1 to CHk respectively. Each semiconductor memory chip may have the same configuration and operation as the semiconductor memory device 1300, described above with reference to FIG. 14.

Memory chips in the same group communicate with the controller 2200 through one common channel. The controller 2200 has the same configuration as the controller 1200, described above with reference to FIG. 14, and is configured to control the plurality of memory chips of the semiconductor memory device 2100 through the plurality of channels CH1 to CHk.

FIG. 15 illustrates that a plurality of semiconductor memory chips are coupled to a single channel. However, it will be understood that the storage device 2000 may be modified such that a single semiconductor memory chip is coupled to a single channel.

Figure 16:
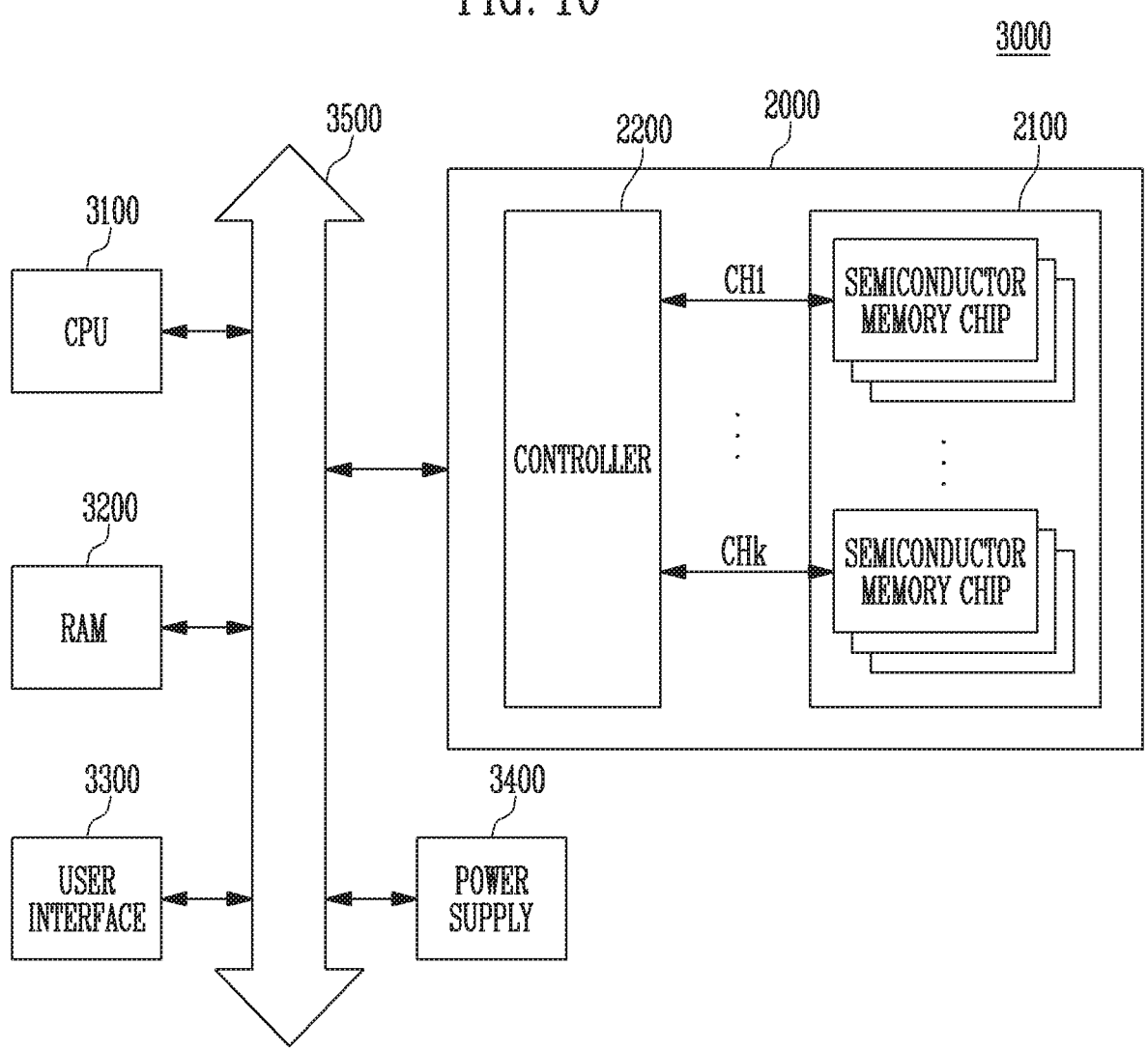
FIG. 16 is a block diagram illustrating a computing system including the storage device described with reference to FIG. 15.

FIG. 16 is a block diagram illustrating a computing system 3000 including the storage device described with reference to FIG. 15.

Referring to FIG. 16, the computing system 3000 may include a central processing unit (CPU) 3100, a random access memory (RAM) 3200, a user interface 3300, a power supply 3400, a system bus 3500, and a storage device 2000.

The storage device 2000 is electrically coupled to the CPU 3100, the RAM 3200, the user interface 3300, and the power supply 3400 through the system bus 3500. Data provided through the user interface 3300 or processed by the CPU 3100 is stored in the storage device 2000.

The semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

The storage device 2000 described with reference to FIG. 15 is illustrated as being provided. However, the storage device 2000 may be replaced with the storage device 1000 described with reference to FIG. 14. In an embodiment, the computing system 3000 may be configured to include all of the storage devices 1000 and 2000 described with reference to FIGS. 14 and 15.

In accordance with an embodiment of the present disclosure, a controller that may efficiently manage a map cache and a method of operating the controller may be provided.

Although embodiments of the present disclosure have been disclosed, those skilled in the art will appreciate that various modifications, additions and substitutions are possible, without departing from the scope and spirit of the present invention.

Therefore, the scope of the present invention is defined by the appended claims and their equivalents, rather than by the description preceding them.

In the above-discussed embodiments, steps may be selectively performed or skipped. In addition, certain steps may not always be sequentially performed in the disclosed order, and instead may be performed in another order. Furthermore, the disclosed embodiments are provided to help those with ordinary knowledge in this art more clearly understand the present disclosure, rather than to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein still fall within the spirit and scope of the present disclosure as defined in the appended claims and their equivalents.

What is claimed is:

1. A controller for controlling an operation of a semiconductor memory device, the controller comprising:
a map cache configured to store a first mapping segment including a plurality of mapping entries and a flag bit; and
a map cache controller configured to:
set a value of the flag bit depending on whether data corresponding to the first mapping segment is random data or sequential data;
receive a second mapping segment from the semiconductor memory device when the second mapping segment corresponding to a read request from a host is in a cache miss in the map cache; and
store the second mapping segment in one of a random map cache and a sequential map cache based on a value of a flag bit included in the second mapping segment.

2. The controller according to claim 1, further comprising a command generator configured to generate a program command storing the first mapping segment in the semiconductor memory device,
wherein the map cache controller controls, based on the read request, an operation of the command generator depending on whether the second mapping segment corresponding to the read request is stored in the map cache.

3. The controller according to claim 2, wherein, when the second mapping segment is stored in the map cache, the map cache controller controls the command generator to generate a read command for reading data corresponding to the read request based on the second mapping segment.

4. The controller according to claim 2, wherein, when the second mapping segment is not stored in the map cache, the map cache controller controls the command generator to generate a read command for reading the second mapping segment.

5. The controller according to claim 2, wherein the map cache controller controls the command generator to generate a read command for reading data corresponding to the read request based on the second mapping segment stored in the map cache.

6. The controller according to claim 1, wherein, when the value of the flag bit indicates that data corresponding to the second mapping segment is random data, the map cache controller stores mapping entries in the second mapping segment in the random map cache.

7. The controller according to claim 1, wherein, when the value of the flag bit indicates that data corresponding to the second mapping segment is sequential data, the map cache controller generates sequential map data based on mapping entries in the second mapping segment and stores the sequential map data in the sequential map cache.

8. The controller according to claim 7, wherein the sequential map data comprises:
data indicating a start location of the sequential data corresponding to the mapping entries in the second mapping segment; and
data indicating a length of the sequential data corresponding to the mapping entries.

9. The controller according to claim 1, wherein the map cache controller is configured to generate the first mapping segment in response to a first request form the host.

10. The controller according to claim 9, wherein the first request includes one of a write request and an update request.

11. A method of operating a controller for controlling a semiconductor memory device, the method comprising:
- receiving a read request of data from a host;
- providing the semiconductor memory device with;
  - a read command for reading a mapping segment corresponding to the data when the mapping segment is in a cache miss in a map cache;
- receiving the mapping segment including a flag bit from the semiconductor memory device; and
- storing the mapping segment in one of a random map cache and a sequential map cache included in the map cache based on a value of the flag bit, wherein, the value of the flag bit is determined based on whether the data corresponding to the mapping segment is sequential data or random data.

12. The method according to claim 11, wherein the storing of the mapping segment in the map cache comprises storing a plurality of mapping entries in the mapping segment in the random map cache of the map cache when the flag bit of the mapping segment indicates that the data corresponding to the mapping segment is the random data.

13. The method according to claim 11, wherein the storing of the mapping segment in the map cache comprises:
- when the flag bit of the mapping segment indicates that the data corresponding to the mapping segment is the sequential data;
- generating sequential map data based on a plurality of mapping entries in the mapping segment; and
- storing the sequential map data in the sequential map cache of the map cache.

14. The method according to claim 13, wherein the sequential map data comprises:
- data indicating a start location of the sequential data corresponding to the mapping entries in the mapping segment; and
- data indicating a length of the sequential data corresponding to the mapping entries.

* * * * *